(12) United States Patent  
Kim

(10) Patent No.: US 7,582,528 B2  
(45) Date of Patent: Sep. 1, 2009

(54) METHOD OF FABRICATING A FLASH MEMORY DEVICE

(75) Inventor: Jae Heon Kim, Gangwon-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/058,612

(22) Filed: Mar. 28, 2008

(65) Prior Publication Data

US 2008/0248646 A1    Oct. 9, 2008

(30) Foreign Application Priority Data

Apr. 6, 2007    (KR) .................. 10-2007-0034228
Feb. 20, 2008   (KR) .................. 10-2008-0015341

(51) Int. Cl.
*H01L 21/8247* (2006.01)

(52) U.S. Cl. ................ 438/258; 257/E21.179

(58) Field of Classification Search ......... 438/257–267; 257/E21.179

See application file for complete search history.

(56) References Cited

U.S. PATENT DOCUMENTS 5,783,471 A * 7/1998 Chu ..................... 438/257

* cited by examiner

*Primary Examiner*—Richard A. Booth
(74) *Attorney, Agent, or Firm*—Townsend and Townsend and Crew LLP

(57) ABSTRACT

In a method of fabricating a flash memory device, an interlayer dielectric layer is formed on a semiconductor substrate. The interlayer dielectric layer is etched to form first contact holes through which junction regions of a cell region are exposed. First contact plugs are formed within the first contact holes. A top surface of the interlayer dielectric layer is etched so that portions of the first contact plugs having the largest width are exposed. The interlayer dielectric layer is etched to form a second contact hole through which a junction region of a peri region is exposed. A second metal layer is formed over the first contact plugs and the interlayer dielectric layer so that the second contact hole is gap-filled. A second contact plug is formed within the second contact hole by removing the second metal layer and the exposed portions of the first contact plugs on the interlayer dielectric layer.

12 Claims, 3 Drawing Sheets

METHOD OF FABRICATING A FLASH MEMORY DEVICE

CROSS-REFERENCES TO RELATED APPLICATIONS

The present application claims priority to Korean patent application number 10-2007-34228, filed on Apr. 6, 2007, and Korean patent application number 10-2008-15341, filed on Feb. 20, 2008, which are incorporated by reference in their entirety.

BACKGROUND OF THE INVENTION

The present invention relates to a method of fabricating a flash memory device and, more particularly, to a method of fabricating a flash memory device, which can prevent the formation of a bridge between neighboring drain contact plugs.

In general, a cell array of a NAND flash device includes a plurality of cell blocks. The cell array of each cell block is divided into strings unlike a typical flash device. A drain contact and a source contact for global ground, which are connected by a bit line, are disposed at opposite ends of the string. The contacts are connected to a junction of a select transistor for string control.

A process of forming the drain contact plug of a conventional flash device is described below. A plurality of string structures, including a source select transistor, a plurality of memory cells and a drain select transistor, are formed in a semiconductor substrate. A source contact plug is formed through a specific process. An interlayer dielectric layer is formed on the entire surface of the semiconductor substrate. Contact holes are formed so that the drain of the drain select transistor is exposed. Tungsten (W) is deposited on the interlayer dielectric layer including the contact holes. A Chemical Mechanical Polishing (CMP) process is then performed to form drain contact plugs that gap-fill the contact holes.

In the above process, the thickness of the dielectric layer, which is to be etched when forming the drain contact holes, is too large, resulting in a bowing phenomenon in which the width at the middle of the contact hole is widened. If the bowing phenomenon becomes severe, the contact holes are interconnected, thereby interconnecting the contact plugs formed within the contact holes. To solve this problem, after a metal layer (for example, a tungsten (W) layer) for forming the drain contact plugs is formed on the interlayer dielectric layer including the contact holes, the metal layer and the interlayer dielectric layer are etched to a depth at which bowing is generated. The etch process can be performed using a CMP process.

However, if the tungsten (W) CMP process is performed to form the contact plugs, tungsten (W) is polished about 50 to 80 times faster than that of an oxide layer. This makes it difficult to remove the oxide layer. Therefore, portions where bowing has occurred on the drain contact holes cannot be removed effectively. Thus, a width of the oxide layer, which isolates the drain contact holes from each other after the CMP process is performed, is narrowed, resulting in bridges between the drain contact plugs. Consequently, the process yield and reliability of a device are degraded.

BRIEF SUMMARY OF THE INVENTION

The present invention is directed towards a method of fabricating a flash memory device, which can prevent the formation of a bridge between neighboring drain contact plugs by effectively removing a bowing shape formed when a contact hole is formed.

In accordance with an aspect of the present invention, a method of fabricating a flash memory device is provided. An interlayer dielectric layer is formed on a semiconductor substrate. The interlayer dielectric layer is etched to form first contact holes through which junction regions of a cell region are exposed. First contact plugs are formed within the first contact holes, respectively. A top surface of the interlayer dielectric layer is etched such that portions of the first contact plugs having the largest width are exposed. The interlayer dielectric layer is etched to form a second contact hole through which a junction region of a peri region is exposed. A second metal layer is formed over the first contact plugs and the interlayer dielectric layer such that the second metal layer is formed over a surface the second contact hole. A second contact plug is formed within the second contact hole by removing the second metal layer and the exposed portions of the first contact plugs on the interlayer dielectric layer.

The first contact plugs and the second contact plug may be formed of tungsten (W).

The formation of the first contact plugs may include forming a first barrier metal layer on the interlayer dielectric layer, including the first contact holes, such that the first barrier metal layer is formed over a surface of each first contact hole. A first metal layer is formed on the first barrier metal layer such that the first contact holes are gap-filled. The first barrier metal layer and the first metal layer formed over the interlayer dielectric layer are removed through a two-step etchback process.

The first metal layer may be formed of tungsten (W). The first barrier metal layer may be formed of Ti/TiN.

In the first step of the etchback process, the first metal layer formed over the interlayer dielectric layer is removed, and in the second step of the etchback process, the first barrier metal layer formed on the interlayer dielectric layer is removed.

The first step of the etchback process may be performed using gases $SF_6$ and $N_2$ as an etch gas. The gas $SF_6$ may have a flow rate which is approximately 8 to 12 times greater than that of the gas $N_2$.

The second step of the etchback process may be performed using gases $Cl_2$ and $BCl_3$ as an etch gas. The gas $Cl_2$ may have a flow rate which is approximately 10 to 12 times greater than that of the gas $BCl_3$.

The etching of the top surface of the interlayer dielectric layer may be performed by a blanket etchback process employing an etch recipe with a high etch selectivity with respect to the interlayer dielectric layer and a relatively lower etch selectivity with respect to the first contact plugs. The blanket etchback process may be performed using a mixed gas of gases $C_xF_y$ (where $4 \leq x \leq 5$, $6 \leq y \leq 8$)/$Ar$/$O_2$ as an etch gas.

The removal of the exposed portions of the first contact plugs may be performed by a CMP process.

When removing the exposed portions of the first contact plugs, the interlayer dielectric layer may be polished to a depth of 500 to 1000 angstroms from a surface of the interlayer dielectric layer.

DESCRIPTION OF SPECIFIC EMBODIMENTS

A specific embodiment according to the present invention will be described with reference to the accompanying drawings. However, the present invention is not limited to the disclosed embodiment, but may be implemented in various configurations. The embodiment is provided to complete the disclosure of the present invention and to allow those having ordinary skill in the art to understand the present invention. The present invention is defined by the scope of the claims.

FIGS. 1A to 1H are sectional views illustrating a method of fabricating a flash memory device in accordance with an embodiment of the present invention.

Figure 1A:
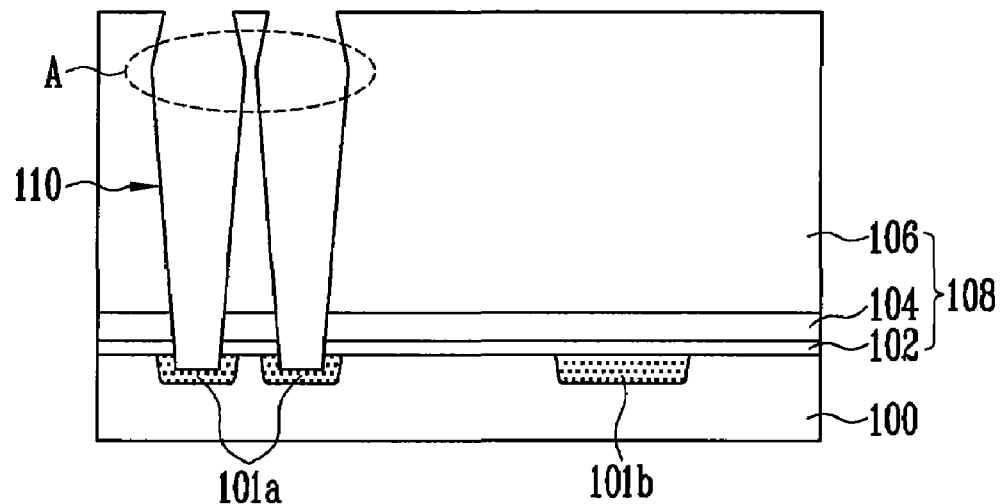
FIGS. 1A to 1H are sectional views illustrating a method of fabricating a flash memory device in accordance with an embodiment of the present invention.

Referring to FIG. 1A, a plurality of string structures, including a source select transistor, a plurality of memory cells and a drain select transistor, are formed in a cell region of a semiconductor substrate 100. (Note: only drains 101a of the drain select transistors are illustrated.) A junction region 101b is formed in a peri region of the semiconductor substrate 100. Although not shown in the drawings, a process of forming source contact plugs is performed on a source of the source select transistor. An interlayer dielectric layer 108, having a stacked structure of a buffer oxide layer 102, a nitride layer 104 and an oxide layer 106, is formed on the semiconductor substrate 100. The oxide layer 106 may be formed of an oxide-based material, such as Spin On Glass (SOG), Boron-Phosphorus Silicate Glass (BPSG), Plasma-Enhanced Tetra Ethyl Ortho Silicate (PETEOS), Undoped Silicate Glass (USG) or Phosphorus Silicate Glass (PSG).

First contact holes 110, through which the drain regions 101a are exposed, are formed by etching a part of the interlayer dielectric layer 108. The first contact holes 110 become drain contact holes. Since the thickness of the interlayer dielectric layer 108 is large, a bowing shape A, in which an upper portion of the first contact hole 110 is widened, is produced as the aspect ratio of the first contact hole 110 is increased.

Figure 1B:
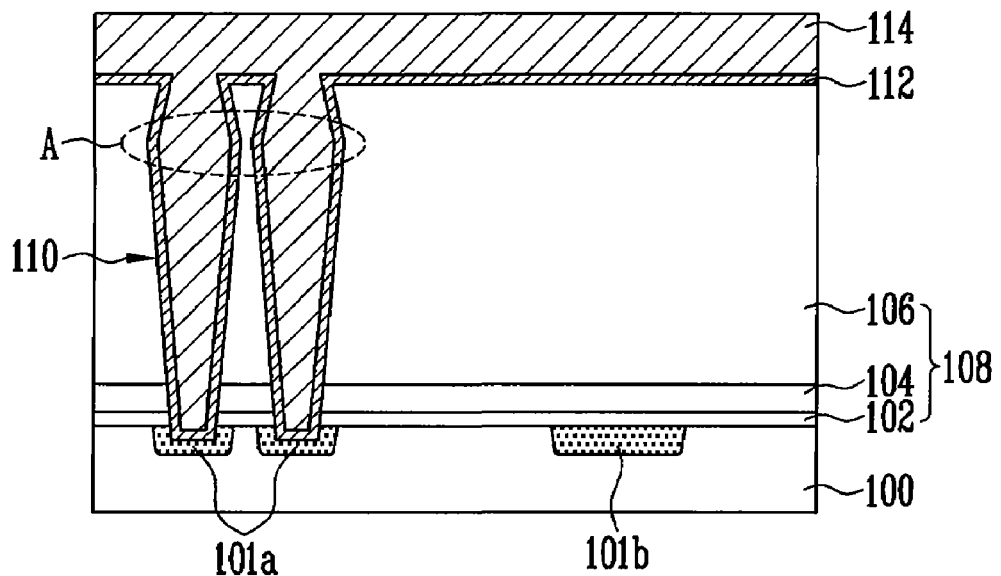

Referring to FIG. 1B, a first barrier metal layer 112 is formed on the interlayer dielectric layer 108, including the first contact holes 110, such that the first barrier metal layer 112 is formed on a surface of the first contact holes 110. The first barrier metal layer 112 may be a stacked layer of Ti/TiN.

A first metal layer 114 is formed on the first barrier metal layer 112 including the first contact holes 110 such that the first contact holes 110 are gap-filled. The first metal layer 114 may be formed of tungsten (W) to improve contact resistance Rc.

Figure 1C:
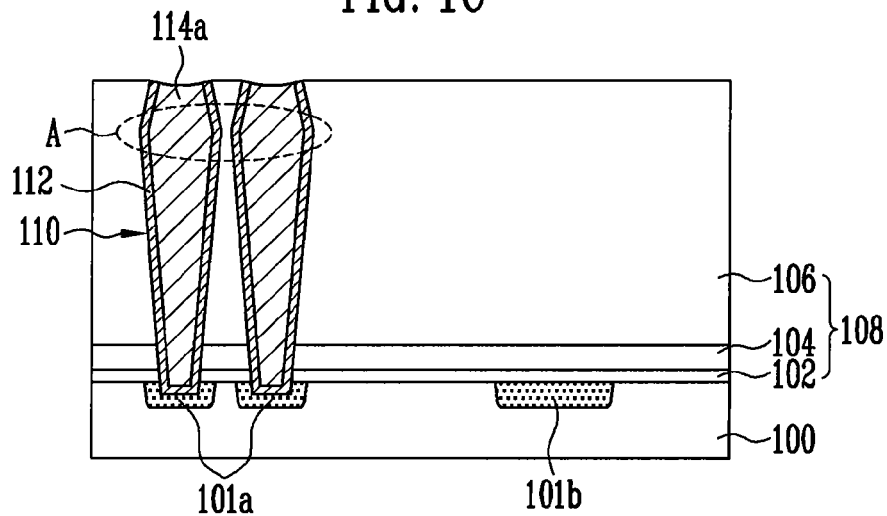

Referring to FIG. 1C, an etch process is performed to remove the first metal layer (refer to 114 of FIG. 1B) and the first barrier metal layer 112 over the interlayer dielectric layer 108. The etch process is performed using a dry etch process. The dry etch process may be performed using an etchback process.

The etchback process is performed in two steps. In the first step, the first metal layer (refer to 114 of FIG. 1B) over the interlayer dielectric layer 108 is removed, and in the second step, the first barrier metal layer 112 on the interlayer dielectric layer 108 is removed.

Specifically, in the first step of the etchback process, gases $SF_6$ and $N_2$ are used as an etch gas. The first metal layer (refer to 114 of FIG. 1B) over the interlayer dielectric layer 108 is removed by injecting the gas $SF_6$ having a flow rate which is about 8 to 12 times greater than that of the gas $N_2$. Thus, the etch rate of the first metal layer (refer to 114 of FIG. 1B) is about 4 to 6 times faster than that of the first barrier metal layer 112.

Furthermore, in the second step of the etchback process, gases $Cl_2$ and $BCl_3$ are used as an etch gas. The first barrier metal layer 112 on the interlayer dielectric layer 108 is removed while minimizing loss of the first metal layer 112 formed within the first contact holes 110 by injecting the gas $Cl_2$ having a flow rate which is about 10 to 12 times greater than that of the gas $BCl_3$. Thus, the etch rate of the first barrier metal layer 112 is about 3 to 5 times faster than that of the first metal layer (refer to 114 of FIG. 1B).

Accordingly, a horizontal portion of the first metal layer 114 and the first barrier metal layer 112 is removed. However, a vertical portion thereof, which is thicker than the horizontal portion, remains. Thus, the first metal layer 114 and the first barrier metal layer 112 remain only within the first contact holes 110. As a result, drain contact plugs 114a consisting of the remaining first metal layer 114 are formed. A distance between the drain contact plugs 114a is narrowed due to the bowing shapes A of the first contact holes 110. In a worst case scenario, a bridge may be formed between adjacent drain contact plugs 114a.

Figure 1D:
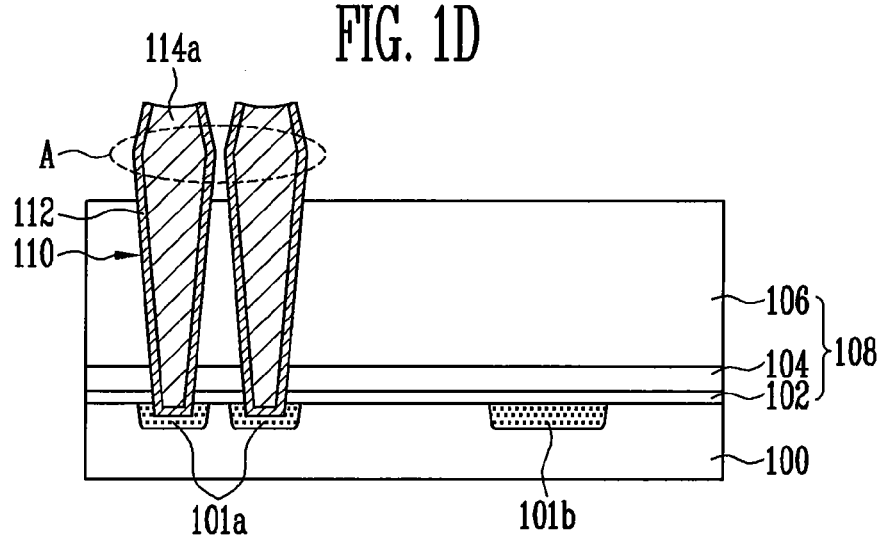

Referring to FIG. 1D, the interlayer dielectric layer 108 is etched past a depth in which the bowing shape A has occurred and past a location where the width of the first contact hole 110 is the widest. The etch process is performed using a dry etch process. The dry etch process may be performed using a blanket etchback process.

The blanket etchback process is performed using an etch recipe with a high etch selectivity with respect to the interlayer dielectric layer 108, and a relatively lower etch selectivity with respect to the drain contact plugs 114a and the first barrier metal layer 112, to selectively etch only the oxide layer 106 of the interlayer dielectric layer 108 without etching the drain contact plugs 114a and the first barrier metal layer 112. In particular, the blanket etchback process may be performed using an etch recipe with a high etch selectivity with respect to the oxide layer 106, and a relatively lower etch selectivity with respect to the drain contact plugs 114a and the first barrier metal layer 112, to selectively etch only part of the oxide layer 106 of the interlayer dielectric layer 108.

In accordance with an embodiment of the present invention, the drain contact plugs 114a are formed of the tungsten (W) layer, and the first barrier metal layer 112 is a stacked layer of Ti/TiN. Thus, the blanket etchback process is performed using an etch recipe with a high etch selectivity with respect to the oxide layer and a relatively lower etch selectivity with respect to the tungsten (W) layer and the Ti/TiN layer. The blanket etchback process is performed using a mixed gas of $C_xF_y$ (where $4 \leq x \leq 5$, $6 \leq y \leq 8$)/$Ar/O_2$ as an etch gas.

Consequently, a top surface of the oxide layer 106 of the interlayer dielectric layer 108 is selectively etched by the blanket etchback process. Thus, a portion of the drain contact plug 114a having the widest width (i.e., the bowing shape A) is exposed.

Figure 1E:
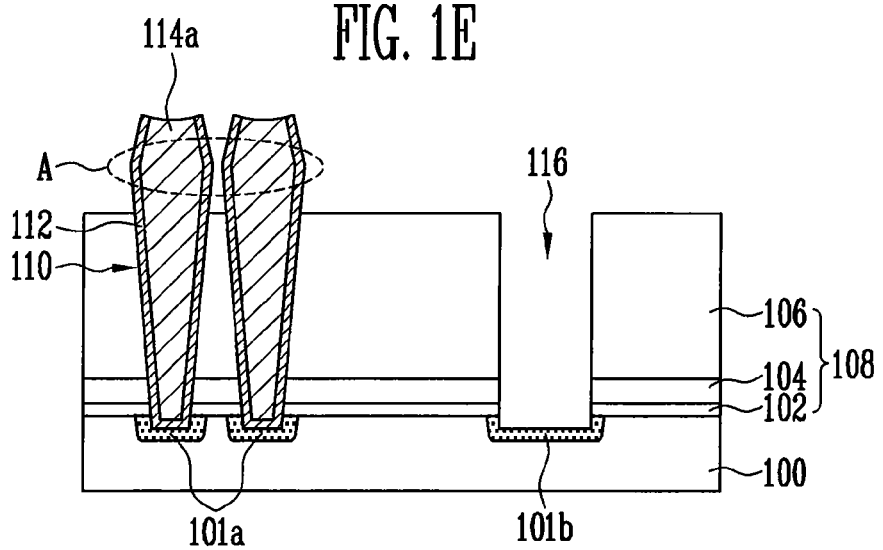

Referring to FIG. 1E, a portion of the interlayer dielectric layer 108, which corresponds to a junction region 101b of the peri region formed in the semiconductor substrate 100, is etched by an etch process using a mask (not shown). The mask may employ a photoresist pattern. The photoresist pattern can be formed by coating a photoresist on the drain contact plugs 114a and the interlayer dielectric layer 108 to form a photoresist film (not shown). A portion of the interlayer dielectric layer 108, which corresponds to the junction region 101b of the peri region, is then patterned through exposure and development employing a previously designed mask.

Accordingly, a second contact hole 116 is formed and the junction region 101b of the peri region is exposed by the etch process. The second contact hole 116 becomes a contact hole for a metal line. The photoresist pattern is then removed.

Figure 1F:
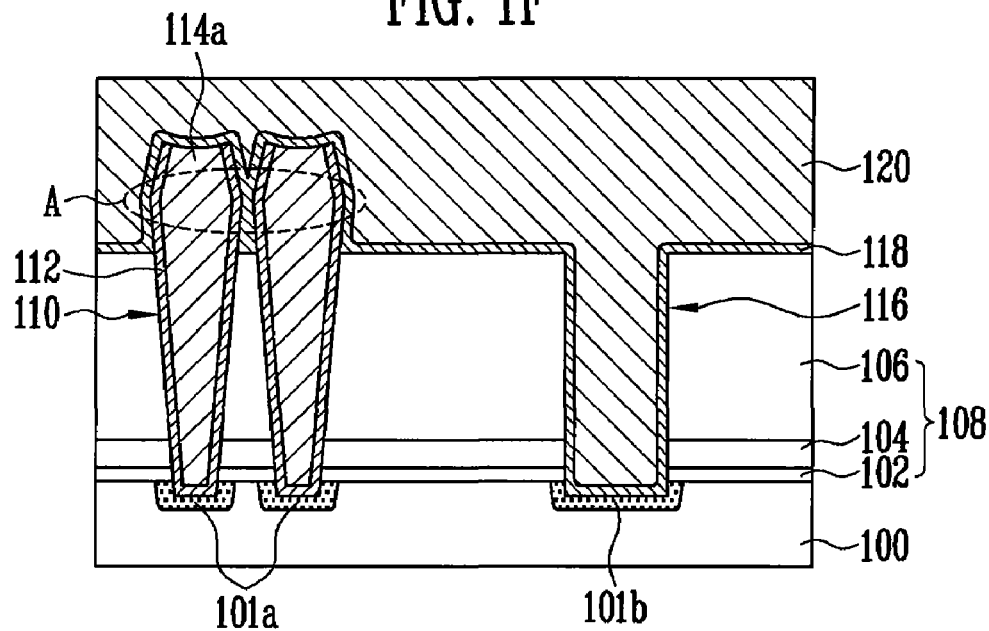

Referring to FIG. 1F, a second barrier metal layer 118 is formed on the interlayer dielectric layer 108 and the drain contact plugs 114a, including the second contact hole 116, such that the second barrier metal layer 118 is formed on an inner surface of the second contact hole 116. The second barrier metal layer 118 may be a stacked layer of Ti/TiN.

A second metal layer 120 is formed on the second barrier metal layer 118, including the second contact hole 116, such that the second contact hole 116 is gap-filled. The second metal layer 120 may be formed of tungsten (W).

Figure 1G:
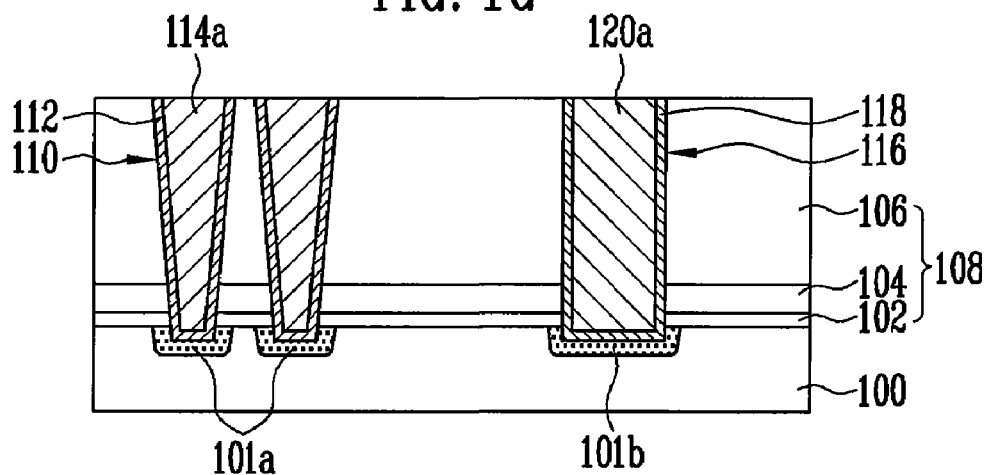

Referring to FIG. 1G, an etch process is performed to remove the second metal layer (refer to 120 of FIG. 1F), the drain contact plugs (refer to 114a of FIG. 1F) and the first and second barrier metal layers (refer to 112 and 118 of FIG. 1F) over the interlayer dielectric layer 108.

The etch process may be performed using a polishing etch process such as a CMP process. The CMP process is performed using the interlayer dielectric layer 108 as a polish-stop layer such that the second metal layer (refer to 120 of FIG. 1F), the drain contact plugs (refer to 114a of FIG. 1F) and the first and second barrier metal layers (refer to 112 and 118 of FIG. 1F) are polished until a surface of the interlayer dielectric layer 108 is exposed.

Consequently, the bowing shapes (refer to A of FIG. 1F), which occurred when forming the first contact holes 110 and were exposed in a subsequent process, are fully removed. Further, the second barrier metal layer 118 and the second metal layer (refer to 120 of FIG. 1F) remain only within the second contact hole 116, thereby forming a metal line contact plug 120a comprised of the second metal layer (refer to 120 of FIG. 1F).

Figure 1H:
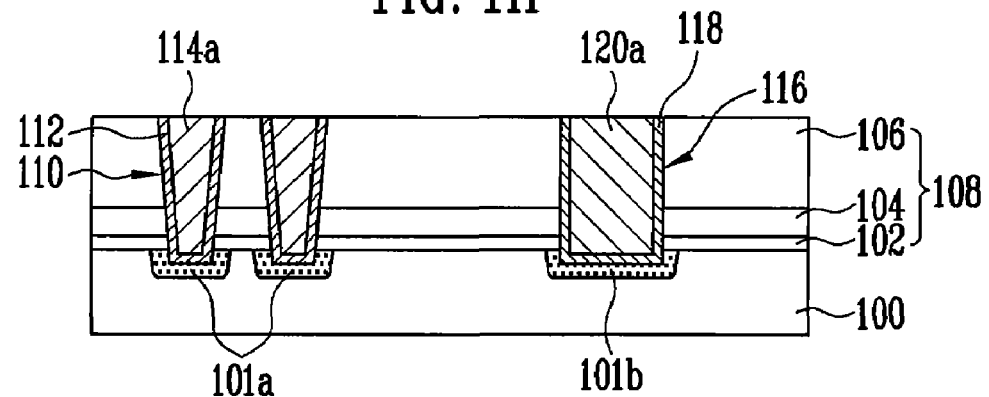

Alternatively, referring to FIG. 1H, after the structure of FIG. 1F is formed, an etch process may be performed to remove the second metal layer (refer to 120 of FIG. 1F), the drain contact plugs (refer to 114a of FIG. 1F), and the first and second barrier metal layers (refer to 112 and 118 of FIG. 1F) over the interlayer dielectric layer 108.

The etch process may be performed using a polishing etch process such as CMP. In particular, the CMP process can be performed using the interlayer dielectric layer 108 as a polish-stop layer. The CMP process may also be performed by polishing the second metal layer (refer to 120 of FIG. 1F), the drain contact plugs (refer to 114a of FIG. 1F), and the first and second barrier metal layers (refer to 112 and 118 of FIG. 1F) up to a depth of 500 to 1000 angstroms from the surface of the interlayer dielectric layer 108 to secure a bridge margin between the drain contact plugs 114a. When etching a part of the interlayer dielectric layer 108 during the CMP process, an etch target of the interlayer dielectric layer 108 is decided considering the height of the target drain contact plug 114a or the metal line contact plug 120a to be formed.

Consequently, the bowing shapes (refer to A of FIG. 1F), which occurred when forming the first contact holes 110 and were exposed in a subsequent process, are fully removed. Furthermore, the second barrier metal layer 118 and the second metal layer (refer to 120 of FIG. 1F) remain only within the second contact hole 116, thereby forming a metal line contact plug 120a comprised of the second metal layer (refer to 120 of FIG. 1F).

As described above, in accordance with an embodiment of the present invention, after the drain contact plugs are formed using the etchback process, a top surface of the interlayer dielectric layer is selectively etched, thereby exposing the bowing shapes generated when forming the contact holes. Thereafter, the metal layer and the exposed portions of the drain contact plugs over the interlayer dielectric layer are removed through a CMP process for forming a subsequent metal line contact plug to remove the bowing shapes.

Since the etch rate between the metal layer and the drain contact plugs is low during the CMP process, the bowing shapes can be removed effectively. Accordingly, a bridge margin of holes, which is caused by the shortage of a process margin in the prior art, can be improved and the width of the interlayer dielectric layer, which isolates the holes from each other, can be increased. Consequently, the formation of a bridge between neighboring drain contact plugs can be prevented and, therefore, the process yield and reliability of a device can be improved.

In particular, by polishing and removing a part of the interlayer dielectric layer simultaneously when the CMP process for forming the metal line contact plug is performed, as in FIG. 1H, the bowing shapes can be removed effectively. The width of the interlayer dielectric layer, which isolates the holes from each other, can be further increased compared with FIG. 1G. Accordingly, the formation of a bridge between neighboring drain contact plugs can be prevented. Furthermore, the formation of a bridge between neighboring drain contact plugs can be prevented through removal of metal residues that may remain in the interlayer dielectric layer.

In addition, the CMP process employing expensive slurry is performed only once when compared with the conventional two CMP processes. Accordingly, the manufacturing costs can be reduced. Incidentally, a bridge margin between the drain contact plugs can be improved effectively without the investment of new equipment. Thus, the process can be performed stably without increasing manufacturing costs.

As described above, the present invention can have the following advantages.

First, after the bowing shapes generated when forming the contact holes are exposed by etching the top surface of the interlayer dielectric layer, the bowing shapes are removed effectively by performing the CMP process for forming a subsequent metal line contact plug. Accordingly, a bridge margin between the contact holes can be improved and, therefore, the formation of a bridge between neighboring drain contact plugs can be prevented.

Second, by polishing the top surface of the interlayer dielectric layer simultaneously when the CMP process for forming the metal line contact plug is performed, the bowing shapes can be removed and the width of the interlayer dielectric layer, which isolates the holes from each other, can also be increased. Accordingly, the formation of a bridge between neighboring drain contact plugs can be prohibited fundamentally. Furthermore, the formation of a bridge between neighboring drain contact plugs can be prohibited through removal of metal residues that may remain in the interlayer dielectric layer.

Third, since the formation of a bridge between neighboring drain contact plugs is prevented, the process yield and reliability of a device can be improved.

Fourth, the manufacturing costs can be reduced because the CMP process employing expensive slurry is performed only once when compared with the conventional two CMP processes.

Fifth, a bridge margin between the drain contact plugs can be improved effectively without the investment of new equipment. Accordingly, the process can be performed stably without increasing manufacturing costs.

The embodiment disclosed herein has been proposed to allow a person skilled in the art to easily implement the present invention. Therefore, the scope of the present invention is not limited by or to the embodiments as described above, and should be construed to be defined only by the appended claims and their equivalents.

What is claimed is:

1. A method of fabricating a flash memory device, the method comprising:
    forming an interlayer dielectric layer over a semiconductor substrate, wherein the semiconductor substrate comprises a cell region and a peripheral region;
    etching the interlayer dielectric layer to form first contact holes, wherein the first contact holes expose junction regions of the cell region;
    forming a first contact plug within each first contact hole;
    etching a top surface of the interlayer dielectric layer such that portions of the first contact plugs having the largest width are exposed;
    etching the interlayer dielectric layer to form a second contact hole, wherein the second contact hole exposes a junction region of the peripheral region;
    forming a second metal layer over the first contact plugs and the interlayer dielectric layer such that the second contact hole is gap-filled; and
    forming a second contact plug within the second contact hole by removing the second metal layer and the exposed portions of the first contact plugs over the interlayer dielectric layer.

2. The method of claim 1, wherein the first contact plugs and the second contact plug are formed of tungsten (W).

3. The method of claim 1, wherein forming the first contact plugs comprises:
    forming a first barrier metal layer over the interlayer dielectric layer including the first contact holes, wherein the first barrier metal layer is formed on an surface of each first contact hole;
    forming a first metal layer over the first barrier metal layer such that the first contact holes are gap-filled; and
    removing the first barrier metal layer and the first metal layer formed over the interlayer dielectric layer through a two-step etchback process.

4. The method of claim 3, wherein the first metal layer comprises tungsten (W).

5. The method of claim 3, wherein the first barrier metal layer comprises Ti/TiN.

6. The method of claim 3, wherein in the first step of the etchback process, the first metal layer formed over the interlayer dielectric layer is removed, and in the second step of the etchback process, the first barrier metal layer formed over the interlayer dielectric layer is removed.

7. The method of claim 6, wherein the first step of the etchback process is performed using gases $SF_6$ and $N_2$ as an etch gas, wherein the gas $SF_6$ has a flow rate which is 8 to 12 times greater than a flow rate of the gas $N_2$.

8. The method of claim 6, wherein the second step of the etchback process is performed using gases $Cl_2$ and $BCl_3$ as an etch gas, wherein the gas $Cl_2$ has a flow rate which is 10 to 12 times greater than a flow rate of the gas $BCl_3$.

9. The method of claim 1, wherein etching the top surface of the interlayer dielectric layer is performed by a blanket etchback process employing an etch recipe with a high etch selectivity with respect to the interlayer dielectric layer and a relatively lower etch selectivity with respect to the first contact plugs.

10. The method of claim 9, wherein the blanket etchback process is performed using a mixed gas of gases $C_xF_y$ (where $4 \leq x \leq 5$, $6 \leq y \leq 8$)/$Ar$/$O_2$ as an etch gas.

11. The method of claim 1, wherein removing the exposed portions of the first contact plugs is performed by a CMP process.

12. The method of claim 11, wherein when removing the exposed portions of the first contact plugs, the interlayer dielectric layer is polished to a depth of 500 to 1000 angstroms from a surface of the interlayer dielectric layer.

* * * * *